(12) United States Patent
Stoye et al.

(10) Patent No.: US 7,219,315 B1
(45) Date of Patent: May 15, 2007

(54) COMPARISON OF SEMICONDUCTOR CIRCUITRY SIMULATIONS

(75) Inventors: William Robert Stoye, Girton (GB); Robert Mark Alistair Murray, Sawston (GB)

(73) Assignee: Tenison Technology EDA Limited, Cambridge (GB)

( * ) Notice: Subject to any disclaimer, the term of this patent is extended or adjusted under 35 U.S.C. 154(b) by 133 days.

(21) Appl. No.: 10/937,726

(22) Filed: Sep. 9, 2004

Related U.S. Application Data

(60) Provisional application No. 60/503,783, filed on Sep. 22, 2003.

(51) Int. Cl.
    *G06F 17/50* (2006.01)
(52) U.S. Cl. ............................................. 716/4; 703/14
(58) Field of Classification Search .................... 716/4, 716/11; 703/14, 16, 23
    See application file for complete search history.

(56) References Cited

U.S. PATENT DOCUMENTS

| | | | |
|---|---|---|---|
| 6,618,839 B1 * | 9/2003 | Beardslee et al. .............. 716/4 |
| 6,885,983 B1 * | 4/2005 | Ho et al. ....................... 703/14 |
| 2003/0225565 A1 * | 12/2003 | Garcia et al. .................. 703/23 |
| 2004/0122644 A1 * | 6/2004 | Neifert et al. ................. 703/16 |
| 2004/0194046 A1 * | 9/2004 | Singhal et al. ................ 716/11 |

* cited by examiner

*Primary Examiner*—Leigh M. Garbowski
(74) *Attorney, Agent, or Firm*—Barnes & Thornburg LLP

(57) ABSTRACT

Disclosed is a method of simulating semiconductor circuitry in which trace data received from a first simulation of the semiconductor circuitry, is processed and the values of inputs to the semiconductor circuitry read from the trace data are output to a second simulation of semiconductor circuitry. There is also disclosed a method of determining whether first and second simulations of semiconductor circuitry are equivalent in which transitions in the values of registers simulated by the first and second simulations are analysed, and an error is declared if, following a register in either simulation making a transition to a value which is not equivalent to the corresponding register in the other simulation. The value of the register in the same simulation makes a further transition to a non-equivalent value before the value of the register in the other simulation makes a transition to an equivalent value.

17 Claims, 23 Drawing Sheets

Program Listing 1.

```
1
2    module simple(clk, reset, count, stop, pass);
3    input clk, reset;
4    input [31:0] count;
5    output stop, pass;
6
7    reg [31:0] r1;
8    reg [31:0] r2;
9    reg stop;
10   reg pass;
11
12   always @(posedge clk or posedge reset)
13   begin
14      if (reset) begin
15         r1 <= 0;
16         r2 <= 0;
17         stop <= 0;
18         pass <= 0;
19
20      end
21      else begin
22          if (count == 7) begin
23             stop <= 1;
24             if ((r1 == 14) && (r2 == 21)) begin
25                      pass <= 1;
26                end
27             end
28          else begin
29             r1 <= r1 + 2;
30             r2 <= r2 + 3;
31             end
32          end
33   end
34   endmodule
```

Fig. 8

Program Listing 2.

```
1
2     `include "simple.v"
3
4     module main ();
5         reg clk, reset;
6         reg [31:0] count;
7         wire      stop, pass;
8
9         simple myTest(clk, reset, count, stop, pass);
10
11        initial
12        begin
13            $dumpfile("logfile.vcd");
14            $dumpvars(0, main);
15
16            clk = 0;
17            reset = 0; // 'bx -> 'b0
18            count <= 0;
19            #10 reset = 1; // posedge forces reset
20            #10 reset = 0;
21        end
22
23        always #80 begin
24            clk = 1;
25            #10 clk = 0;
26            #10
27
28            if (stop) begin
29              if (pass) $display("%d: PASS", count);
30              else $display("%d: FAIL", count);
31
32              $finish(0);
33            end
34            if (count >= 1000000) begin
35                $display("FAIL - timed out");
36                $finish(1);
37            end
38
39            count <= (clk)?count:count+1;
40        end
41
42    endmodule
```

Fig. 9

Program Listing 3.

```
1   $date
2       Jul  8, 2003  15:27:50
3   $end
4   $version
5       Tool: VERILOG-XL 05.00.001-p
6   $end
7   $timescale
8       1s
9   $end
10
11  $scope module main $end
12  $var reg        1  !    clk    $end
13  $var reg        1  "    reset  $end
14  $var reg       32  #    count [31:0] $end
15  $var wire       1  $    stop   $end
16  $var wire       1  %    pass   $end
17
18  $scope module myTest $end
19  $var wire       1  &    clk    $end
20  $var wire       1  '    reset  $end
21  $var wire      32  (    count [31:0] $end
22  $var reg       32  )    r1 [31:0] $end
23  $var reg       32  *    r2 [31:0] $end
24  $var reg        1  +    stop   $end
25  $var reg        1  ,    pass   $end
26  $upscope $end
27
28  $upscope $end
29
30  $enddefinitions $end
31  $dumpvars
32  0!
33  0")
34  b00000000000000000000000000000000 #
35  x$
36  x%
37  0&
38  0'
39  b00000000000000000000000000000000 (
40  bxxxxxxxxxxxxxxxxxxxxxxxxxxxxxxxx )
41  bxxxxxxxxxxxxxxxxxxxxxxxxxxxxxxxx *
42  x+
43  x,
44  $end
45  #10
46
34  b00000000000000000000000000000000 #
35  x$
36  x%
37  0&
38  0'
39  b00000000000000000000000000000000 (
40  bxxxxxxxxxxxxxxxxxxxxxxxxxxxxxxxx 1"
47  1'
48  b00000000000000000000000000000000 )
```

Program Listing 4.

```
1   /* vtoc -msmode -second-pass -root simple +libext+.v+
2   /* User=robm */
3   /*OutputfromVTOCVersion=1.3.1/VC10b/TTCVAEDACOREVersion=1.3(08-
4   Jul-2003-
5   
6       Code generated automatically under a Tenison internal developer's
7       license by VTOC(tm), the Verilog/VHDL to C compiler from
8       Tenison EDA.
9   
10      This code is the property of the owner of the original Verilog/VHDL,
11      who may use it within the terms of their agreement with Tenison EDA.
12      Tenison EDA make no claim to rights or responsibility for this code.
13      ----------------------------------------------------------------- */
14  #define TT_VNO 16
15  
16  #include <stdio.h>
17  
18  #define SECTION_NAME simple
19  #define TT_CPP
20  #include "cxcpptypes.h"
21  #include "ttvtoc.h"
22  
23  #include "simple.h"
24  
25  
26  /* Start of TT generated C++ code */
27  
28  
29  
30  void simple::initials()
31  {
32      *stop = 0U;
33  
34      *pass = 0U;
```

Fig. 11A

```
35        r2_PM101 = 0U;
36        r1_PM101 = 0U;
37        count_PM101 = 0U;
38        r1 = 0U;
39        r2 = 0U;
40        clk_p_historic = 1U;
41    }
42
43    void simple::tt_netlist(u1 &clk__, u1 &reset__, u32 &count__, u1 &stop__, u1 &
44    pass__)
45    {
46        clk = &clk__;
47        reset = &reset__;
48        count = &count__;
49        stop = &stop__;
50        pass = &pass__;
51
52        TT_DEFINE_SNET("clk_p_historic", &clk_p_historic, TT_wire | TT_internal, 64,
53    0);
54
55        TT_DEFINE_SNET("clk", &clk, TT_input, 512, 0);
56
57        TT_DEFINE_SNET("reset", &reset, TT_input, 0, 0);
58
59        TT_DEFINE_VNET("count", &count, 31, 0, TT_input, 0, 0);
```

Fig. 11B

```
72
73   TT_DEFINE_SNET("stop", &stop, TT_output, 129, 0);
74
75   TT_DEFINE_SNET("pass", &pass, TT_output, 129, 0);
76
77
78   TT_DEFINE_VNET("r2_PM101", &r2_PM101, 31, 0, TT_wire | TT_internal, 64, &r2);
79
80
81   TT_DEFINE_VNET("r1_PM101", &r1_PM101, 31, 0, TT_wire | TT_internal, 64, &r1);
82
83
84   TT_DEFINE_VNET("count_PM101", &count_PM101, 31, 0, TT_wire | TT_internal, 64,
85   count);
86
87   TT_DEFINE_VNET("r1", &r1, 31, 0, TT_reg, 129, 0);
88
89   TT_DEFINE_VNET("r2", &r2, 31, 0, TT_reg, 129, 0);
90
91   }
92
93
94   void simple::wave_999()
95   {
96     if (*reset)
97     {
98        r1 = 0;
99
100       *stop = 0U;
101
102       *pass = 0U;
103
104       r2 = 0;
105
106   }
107   else if (*clk && !clk_p_historic)
108   {
```

*Fig. 11C*

```
109        r1 = ((count_PM101==7) ? r1:0xFFFFFFFFU & (r1_PM101 + 2U));
110        r2 = ((count_PM101==7) ? r2:0xFFFFFFFFU & (r2_PM101 + 3U));
111
112        *pass = ((count_PM101==7 && r1_PM101==14 && r2_PM101==21) ? 1U:*pass);
113
114        *stop = ((count_PM101==7) ? 1U:*stop);
115
116    }
117    count_PM101 = *count;
118
119    r1_PM101 = r1;
120
121    r2_PM101 = r2;
122
123    clk_p_historic = *clk;
124
125 }
126
127 void simple::slave()
128
129 {
130     /* Reupdate slave method */
131
132 }
133
134 void simple::step()
135 {
136
137     /* Now follow sequential logic updates */
138     wave_999();
139
140
141 }
142
143 /* EOF */
```

*Fig. 11D*

Program Listing 5.
```
 1
 2  ================================================================
 3  A normal interactive run, with 'verbose' information reports........
 4  ================================================================
 5
 6  $ simple -i
 7  VTOC Command Prompt
 8
 9  time=0: 0 of 7 values traced: ready
10  vtoc> mtc
11
12  time=0: 0 of 7 values traced: ready
13  vtoc-mtc> verbose
14  Model/Trace Compare: verbose is: on
15
16  time=0: 0 of 7 values traced: ready
17  vtoc-mtc> map toplevel = main.myTest
18  Added mapping toplevel = main.myTest
19
20  time=0: 0 of 7 values traced: ready
21  vtoc-mtc> open logfile.vcd
22  VCD date: Jul 8, 2003 15:04:12
23  VCD version: Tool: VERILOG-XL 05.00.001-p
24
25  The Trace file contains 12 signals:
26      7 match variables in the model
27      5 not matched to any variable in the model
28      4 variables can be compared, 4 in trace
29      3 input signals found:
30      toplevel.reset
31      toplevel.count
32      toplevel.clk
33
34  time=0: 0 of 7 values traced: ready
35  vtoc-mtc> c
36  Model/Trace Compare: monitoring 4 of 4 variables in the model
37  Model/Trace Compare: Running simulation to completion
38  Time: 0: 0 signals out-of-sync
39
40  Time: 790: End of Trace File Reached
41
42
43    toplevel.reset:   Changes:3        (Input)
44    toplevel.count:   Changes:8        (Input)
45     toplevel.clk:    Changes:17       (Input)
46    toplevel.pass:    Changes:1        Max Sync Time: 10
47    toplevel.stop:    Changes:1        Max Sync Time: 10
48       toplevel.r2:   Changes:7        Max Sync Time: 20
49       toplevel.r1:   Changes:7        Max Sync Time: 20
50
51  Model/Trace Compare:
52    Made 28 changes in 3 inputs
53    Compared 16 changes in 4 signals
54    Longest time to synchronise was 20
55    0 differences found
```

Fig. 12A

```
  1   Program Listing 5.
  2
 56   time=790: 0 of 7 values traced: ready
 57   vtoc-mtc> q
 58   $
 59
 60   ================================================================
 61   The same again, but with a deliberate difference placed in the
 62   VCD trace at time 280...
 63   ================================================================
 64
 65   $ simple -I
 66   VTOC Command Prompt
 67
 68   time=0: 0 of 7 values traced: ready
 69   vtoc> mtc
 70
 71   time=0: 0 of 7 values traced: ready
 72   vtoc-mtc> verbose
 73   Model/Trace Compare: verbose is: on
 74
 75   time=0: 0 of 7 values traced: ready
 76   vtoc-mtc> map toplevel.=main.myTest
 77   Added mapping toplevel = main.myTest
 78
 79   time=0: 0 of 7 values traced: ready
 80   vtoc-mtc> open logfile-error.vcd
 81   VCD date: Jul 8, 2003 15:07:16
 82   VCD version: Tool: VERILOG-XL 05.00.001-p
 83
 84   The Trace file contains 12 signals:
 85      7 match variables in the model
 86      5 not matched to any variable in the model
 87      4 variables can be compared, 4 in trace
 88   3 input signals found:
 89      toplevel.reset
 90      toplevel.count
 91      toplevel.clk
 92
 93   time=0: 0 of 7 values traced: ready
 94   vtoc-mtc> c
 95   Model/Trace Compare: monitoring 4 of 4 variables in the model
 96   Model/Trace Compare: Running simulation to completion
 97   Time: 0: 0 signals out-of-sync
 98   Time: 280: Bad state change in Model: toplevel.r1
 99   Trace Value: 00000000000000000000000000000100 ->
100   00000000000100000000000000000110
101   Model Value: 00000000000000000000000000000110
102   Time: 300: 1 signal out-of-sync
103   Time: 400: Back in-sync: toplevel.r1
104   Time: 400: 0 signals out-of-sync
105
106   Time: 790: End of Trace File Reached
107
108
109         toplevel.reset:   Changes:3      (Input)
110         toplevel.count:   Changes:8      (Input)
```

Fig. 12B

Program Listing 5.

```
111         toplevel.clk:   Changes:17     (Input)
112         toplevel.pass:  Changes:1      Max Sync Time: 10
113         toplevel.stop:  Changes:1      Max Sync Time: 10
114         toplevel.r2:    Changes:7      Max Sync Time: 20
115         toplevel.r1:    Changes:6      Max Sync Time: 20
116
117  Model/Trace Compare:
118    Made 28 changes in 3 inputs
119    Compared 15 changes in 4 signals
120    Longest time to synchronise was 20
121    1 differences found
122
123  time=790: 0 of 7 values traced: ready
124  vtoc-mtc> q
125  $
126
127  ================================================================
128  The same thing, but show each change in a model value and each
129  state change in the MTC.....
130  ================================================================
131
132  $ ./simple -i
133  VTOC Command Prompt
134
135  time=0: 0 of 7 values traced: ready
136  vtoc> mtc
137
138  time=0: 0 of 7 values traced: ready
139  vtoc-mtc> verbose
140  Model/Trace Compare: verbose is: on
141
142  time=0: 0 of 7 values traced: ready
143  vtoc-mtc> map toplevel = main.myTest
144  Added mapping toplevel = main.myTest
145
146  time=0: 0 of 7 values traced: ready
147  vtoc-mtc> open logfile.vcd
148  VCD date: Jul 8, 2003 15:07:16
149  VCD version: Tool: VERILOG-XL 05.00.001-p
150
151  The Trace file contains 12 signals:
152      7 match variables in the model
153      5 not matched to any variable in the model
154      4 variables can be compared, 4 in trace
155  3 input signals found:
156      toplevel.reset
157      toplevel.count
158      toplevel.clk
159  Time: 0: Step
160
161  time=0: 0 of 7 values traced: ready
162  vtoc-mtc> show *
163  toplevel.clk     i   : 0
164  toplevel.count   i   : 00000000
165  toplevel.pass    m r : 0
```

Fig. 12C

```
Program Listing 5.
166    toplevel.r1     m r: 00000000
167    toplevel.r2     m r: 00000000
168    toplevel.reset i  : 0
169    toplevel.stop  m r: 0
170    Model/Trace Compare: monitoring 4 of 4 variables in the model
171
172    time=0: 7 of 7 values traced: ready
173    vtoc-mtc> c
174    Model/Trace Compare: monitoring 4 of 4 variables in the model
175    Model/Trace Compare: Running simulation to completion
176    Time: 0: 0 signals out-of-sync
177           10: toplevel.reset = 1
178    Time: 10: Step
179           80: toplevel.reset = 0
180    Time: 80: Step
181           80: toplevel.clk   = 1
182    Time: 80: Step
183          100: toplevel.clk   = 0
184    Time: 80: TtVCDTrace: setState for toplevel.r2  -
185    ValuesMatch->WaitingForLiveModel (after 80)
186    Time: 80: TtVCDTrace: setState for toplevel.r1  -
187    ValuesMatch->WaitingForLiveModel (after 80)
188          100: toplevel.r1    = 00000002
189    Time: 100: TtVCDTrace: setState for toplevel.r1 -
190    WaitingForLiveModel->ValuesMatch (after 20)
191          100: toplevel.r2    = 00000003
192    Time: 100: TtVCDTrace: setState for toplevel.r2 -
193    WaitingForLiveModel->ValuesMatch (after 20)
194    Time: 100: Step
195          180: toplevel.count = 00000001
196    Time: 180: Step
197          180: toplevel.clk   = 1
198    Time: 180: Step
199          200: toplevel.clk   = 0
200    Time: 180: TtVCDTrace: setState for toplevel.r2 -
201    ValuesMatch->WaitingForLiveModel (after 80)
202    Time: 180: TtVCDTrace: setState for toplevel.r1 -
203    ValuesMatch->WaitingForLiveModel (after 80)
204          200: toplevel.r1    = 00000004
205    Time: 200: TtVCDTrace: setState for toplevel.r1 -
206    WaitingForLiveModel->ValuesMatch (after 20)
207          200: toplevel.r2    = 00000006
208    Time: 200: TtVCDTrace: setState for toplevel.r2 -
209    WaitingForLiveModel->ValuesMatch (after 20)
210    Time: 200: Step
211          280: toplevel.count = 00000002
212    Time: 280: Step
213          280: toplevel.clk   = 1
214    Time: 280: Step
215          300: toplevel.clk   = 0
216    Time: 280: TtVCDTrace: setState for toplevel.r2 -
217    ValuesMatch->WaitingForLiveModel (after 80)
218    Time: 280: TtVCDTrace: setState for toplevel.r1 -
219    ValuesMatch->WaitingForLiveModel (after 80)
220          300: toplevel.r1    = 00000006
```

Fig. 12D

Program Listing 5.

```
221    Time: 300: TtVCDTrace: setState for toplevel.r1 -
222    WaitingForLiveModel->ValuesMatch (after 20)
223       300: toplevel.r2    = 00000009
224    Time: 300: TtVCDTrace: setState for toplevel.r2 -
225    WaitingForLiveModel->ValuesMatch (after 20)
226    Time: 300: Step
227       380: toplevel.count = 00000003
228    Time: 380: Step
229       380: toplevel.clk   = 1
230    Time: 380: Step
231       400: toplevel.clk   = 0
232    Time: 380: TtVCDTrace: setState for toplevel.r2 -
233    ValuesMatch->WaitingForLiveModel (after 80)
234    Time: 380: TtVCDTrace: setState for toplevel.r1 -
235    ValuesMatch->WaitingForLiveModel (after 80)
236       400: toplevel.r1    = 00000008
237    Time: 400: TtVCDTrace: setState for toplevel.r1 -
238    WaitingForLiveModel->ValuesMatch (after 20)
239       400: toplevel.r2    = 0000000c
240    Time: 400: TtVCDTrace: setState for toplevel.r2 -
241    WaitingForLiveModel->ValuesMatch (after 20)
242    Time: 400: Step
243       480: toplevel.count = 00000004
244    Time: 480: Step
245       480: toplevel.clk   = 1
246    Time: 480: Step
247       500: toplevel.clk   = 0
248    Time: 480: TtVCDTrace: setState for toplevel.r2 -
249    ValuesMatch->WaitingForLiveModel (after 80)
250    Time: 480: TtVCDTrace: setState for toplevel.r1 -
251    ValuesMatch->WaitingForLiveModel (after 80)
252       500: toplevel.r1    = 0000000a
253    Time: 500: TtVCDTrace: setState for toplevel.r1 -
254    WaitingForLiveModel->ValuesMatch (after 20)
255       500: toplevel.r2    = 0000000f
256    Time: 500: TtVCDTrace: setState for toplevel.r2 -
257    WaitingForLiveModel->ValuesMatch (after 20)
258    Time: 500: Step
259       580: toplevel.count = 00000005
260    Time: 580: Step
261       580: toplevel.clk   = 1
262    Time: 580: Step
263       600: toplevel.clk   = 0
264    Time: 580: TtVCDTrace: setState for toplevel.r2 -
265    ValuesMatch->WaitingForLiveModel (after 80)
266    Time: 580: TtVCDTrace: setState for toplevel.r1 -
267    ValuesMatch->WaitingForLiveModel (after 80)
268       600: toplevel.r1    = 0000000c
269    Time: 600: TtVCDTrace: setState for toplevel.r1 -
270    WaitingForLiveModel->ValuesMatch (after 20)
271       600: toplevel.r2    = 00000012
272    Time: 600: TtVCDTrace: setState for toplevel.r2 -
273    WaitingForLiveModel->ValuesMatch (after 20)
274    Time: 600: Step
275       680: toplevel.count = 00000006
```

Fig. 12E

```
     Program Listing 5.
276  Time: 680: Step
277       680: toplevel.clk   = 1
278  Time: 680: Step
279       700: toplevel.clk   = 0
280  Time: 680: TtVCDTrace: setState for toplevel.r2   -
281  ValuesMatch->WaitingForLiveModel (after 80)
282  Time: 680: TtVCDTrace: setState for toplevel.r1   -
283  ValuesMatch->WaitingForLiveModel (after 80)
284       700: toplevel.r1    = 0000000e
285  Time: 700: TtVCDTrace: setState for toplevel.r1   -
286  WaitingForLiveModel->ValuesMatch (after 20)
287       700: toplevel.r2    = 00000015
288  Time: 700: TtVCDTrace: setState for toplevel.r2   -
289  WaitingForLiveModel->ValuesMatch (after 20)
290  Time: 700: Step
291       780: toplevel.count = 00000007
292  Time: 780: Step
293       780: toplevel.clk   = 1
294  Time: 780: Step
295       790: toplevel.clk   = 0
296  Time: 780: TtVCDTrace: setState for toplevel.pass -
297  ValuesMatch->WaitingForLiveModel (after 780)
298  Time: 780: TtVCDTrace: setState for toplevel.stop -
299  ValuesMatch->WaitingForLiveModel (after 780)
300       790: toplevel.stop  = 1
301  Time: 790: TtVCDTrace: setState for toplevel.stop -
302  WaitingForLiveModel->ValuesMatch (after 10)
303       790: toplevel.pass  = 1
304  Time: 790: TtVCDTrace: setState for toplevel.pass -
305  WaitingForLiveModel->ValuesMatch (after 10)
306  Time: 790: Step
307
308  Time: 790: End of Trace File Reached
309
310
311       toplevel.reset:  Changes:3      (Input)
312       toplevel.count:  Changes:8      (Input)
313        toplevel.clk:   Changes:17     (Input)
314       toplevel.pass:   Changes:1      Max Sync Time: 10
315       toplevel.stop:   Changes:1      Max Sync Time: 10
316         toplevel.r2:   Changes:7      Max Sync Time: 20
317         toplevel.r1:   Changes:7      Max Sync Time: 20
318
319  Model/Trace Compare:
320     Made 28 changes in 3 inputs
321     Compared 16 changes in 4 signals
322     Longest time to synchronise was 20
323     0 differences found
324
325  time=790: 7 of 7 values traced: ready
326  vtoc-mtc> q
327  $
```

*Fig. 12F*

Program Listing 5.

```
328  =============================================================
329  The same again, with the error...
330  =============================================================
331
332  $ simple -i
333  VTOC Command Prompt
334
335  time=0: 0 of 7 values traced: ready
336  vtoc> mtc
337
338  time=0: 0 of 7 values traced: ready
339  vtoc-mtc> verbose
340  Model/Trace Compare: verbose is: on
341
342  time=0: 0 of 7 values traced: ready
343  vtoc-mtc> map toplevel.=main.myTest
344  Added mapping toplevel = main.myTest
345
346  time=0: 0 of 7 values traced: ready
347  vtoc-mtc> open logfile-error.vcd
348  VCD date: Jul 8, 2003 15:07:16
349  VCD version: Tool: VERILOG-XL 05.00.001-p
350
351  The Trace file contains 12 signals:
352      7 match variables in the model
353      5 not matched to any variable in the model
354      4 variables can be compared, 4 in trace
355  3 input signals found:
356      toplevel.reset
357      toplevel.count
358      toplevel.clk
359  Time: 0: Step
360
361  time=0: 0 of 7 values traced: ready
362  vtoc-mtc> c
363  Model/Trace Compare: monitoring 4 of 4 variables in the model
364  Model/Trace Compare: Running simulation to completion
365  Time: 0: 0 signals out-of-sync
366  Time: 10: Step
367  Time: 80: Step
368  Time: 80: Step
369  Time: 80: TtVCDTrace: setState for toplevel.r2  -
370  ValuesMatch->WaitingForLiveModel (after 80)
371  Time: 80: TtVCDTrace: setState for toplevel.r1  -
372  ValuesMatch->WaitingForLiveModel (after 80)
373  Time: 100: TtVCDTrace: setState for toplevel.r1  -
374  WaitingForLiveModel->ValuesMatch (after 20)
375  Time: 100: TtVCDTrace: setState for toplevel.r2  -
376  WaitingForLiveModel->ValuesMatch (after 20)
377  Time: 100: Step
378  Time: 180: Step
379  Time: 180: Step
380  Time: 180: TtVCDTrace: setState for toplevel.r2  -
381  ValuesMatch->WaitingForLiveModel (after 80)
382  Time: 180: TtVCDTrace: setState for toplevel.r1
```

Fig. 12G

Program Listing 5.
```
383  ValuesMatch->WaitingForLiveModel (after 80)
384  Time: 200: TtVCDTrace: setState for toplevel.r1   -
385  WaitingForLiveModel->ValuesMatch (after 20)
386  Time: 200: TtVCDTrace: setState for toplevel.r2   -
387  WaitingForLiveModel->ValuesMatch (after 20)
388  Time: 200: Step
389  Time: 280: Step
390  Time: 280: Step
391  Time: 280: TtVCDTrace: setState for toplevel.r2   -
392  ValuesMatch->WaitingForLiveModel (after 80)
393  Time: 280: TtVCDTrace: setState for toplevel.r1   -
394  ValuesMatch->WaitingForLiveModel (after 80)
395  Time: 280: Bad state change in Model: toplevel.r1
396      Trace Value: 00000000000000000000000000000100 ->
397  00000000000100000000000000000110
398      Model Value: 00000000000000000000000000000110
399  Time: 300: TtVCDTrace: setState for toplevel.r1   -
400  WaitingForLiveModel->OutOfSync (after 20)
401  Time: 300: TtVCDTrace: setState for toplevel.r2   -
402  WaitingForLiveModel->ValuesMatch (after 20)
403  Time: 300: Step
404  Time: 300: 1 signal out-of-sync
405  Time: 380: Step
406  Time: 380: Step
407  Time: 380: TtVCDTrace: setState for toplevel.r2   -
408  ValuesMatch->WaitingForLiveModel (after 80)
409  Time: 400: Back in-sync: toplevel.r1
410  Time: 400: TtVCDTrace: setState for toplevel.r1   - OutOfSync-4114
     >ValuesMatch
411  (after 100)
412  Time: 400: TtVCDTrace: setState for toplevel.r2   -
413  WaitingForLiveModel->ValuesMatch (after 20)
414  Time: 400: Step
415  Time: 400: 0 signals out-of-sync
416  Time: 480: Step
417  Time: 480: Step
418  Time: 480: TtVCDTrace: setState for toplevel.r2   -
419  ValuesMatch->WaitingForLiveModel (after 80)
420  Time: 480: TtVCDTrace: setState for toplevel.r1   -
421  ValuesMatch->WaitingForLiveModel (after 80)
422  Time: 500: TtVCDTrace: setState for toplevel.r1   -
423  WaitingForLiveModel->ValuesMatch (after 20)
424  Time: 500: TtVCDTrace: setState for toplevel.r2   -
425  WaitingForLiveModel->ValuesMatch (after 20)
426  Time: 500: Step
427  Time: 580: Step
428  Time: 580: Step
429  Time: 580: TtVCDTrace: setState for toplevel.r2   -
430  ValuesMatch->WaitingForLiveModel (after 80)
431  Time: 580: TtVCDTrace: setState for toplevel.r1   -
432  ValuesMatch->WaitingForLiveModel (after 80)
433  Time: 600: TtVCDTrace: setState for toplevel.r1   -
434  WaitingForLiveModel->ValuesMatch (after 20)
435  Time: 600: TtVCDTrace: setState for toplevel.r2   -
436  WaitingForLiveModel->ValuesMatch (after 20)
437  Time: 600: Step
```

Fig. 12H

```
     Program Listing 5.
438  Time: 680: Step
439  Time: 680: Step
440  Time: 680: TtVCDTrace: setState for toplevel.r2   -
441  ValuesMatch->WaitingForLiveModel (after 80)
442  Time: 680: TtVCDTrace: setState for toplevel.r1   -
443  ValuesMatch->WaitingForLiveModel (after 80)
444  Time: 700: TtVCDTrace: setState for toplevel.r1   -
445  WaitingForLiveModel->ValuesMatch (after 20)
446  Time: 700: TtVCDTrace: setState for toplevel.r2   -
447  WaitingForLiveModel->ValuesMatch (after 20)
448  Time: 700: Step
449  Time: 780: Step
450  Time: 780: Step
451  Time: 780: TtVCDTrace: setState for toplevel.pass -
452  ValuesMatch->WaitingForLiveModel (after 780)
453  Time: 780: TtVCDTrace: setState for toplevel.stop -
454  ValuesMatch->WaitingForLiveModel (after 780)
455  Time: 790: TtVCDTrace: setState for toplevel.stop -
456  WaitingForLiveModel->ValuesMatch (after 10)
457  Time: 790: TtVCDTrace: setState for toplevel.pass -
458  WaitingForLiveModel->ValuesMatch (after 10)
459  Time: 790: Step
460
461  Time: 790: End of Trace File Reached
462
463
464       toplevel.reset:  Changes:3      (Input)
465       toplevel.count:  Changes:8      (Input)
466       toplevel.clk:    Changes:17     (Input)
467       toplevel.pass:   Changes:1      Max Sync Time: 10
468       toplevel.stop:   Changes:1      Max Sync Time: 10
469       toplevel.r2:     Changes:7      Max Sync Time: 20
470       toplevel.r1:     Changes:6      Max Sync Time: 20
471
472  Model/Trace Compare:
473    Made 28 changes in 3 inputs
474    Compared 15 changes in 4 signals
475    Longest time to synchronise was 20
476    1 differences found
477
478  time=790: 0 of 7 values traced: ready
479  vtoc-mtc> q
480  $
```

*Fig. 12I*

COMPARISON OF SEMICONDUCTOR CIRCUITRY SIMULATIONS

This application is the non-provisional filing of provisional application No. 60/503,783, filed Sep. 22, 2003.

FIELD OF THE INVENTION

The invention relates in general to the field of software-implemented simulations of semiconductor circuitry. In particular, the invention relates to a method and software for validating that two simulations of semiconductor circuitry produce equivalent output. The invention is particularly applicable for the comparison of a simulation of a register transfer level (RTL) model and a cycle-accurate model of the same semiconductor circuitry.

BACKGROUND TO THE INVENTION

At the present time, semiconductor circuitry (comprising one or more microchips, or parts thereof) is generally designed by a multi-stage process. Initially, a hardware designer will specify the function of the semiconductor circuitry at a system level. For example, they may define the function of the semiconductor circuitry in a language such as C, C++, System C, or through a modelling software package such as MatLab (MatLab is a Trade Mark). This architectural modelling process may also be carried out in a hardware description language (see below). System level design includes specification of the semiconductor circuitry at a modular level, and determination of outputs of the semiconductor circuitry, or modules thereof, in response to a given sequence of inputs.

Thereafter, a semiconductor circuitry designer will specify the structure of the semiconductor circuitry in the form of a hardware description language (HDL). At the present time, the most commonly used HDLs are Verilog and VHDL (Verilog and VHDL are Trade Marks). Verilog is specified in IEEE Computer Society Standard 1364.1 (1364.1 is a Trade Mark). HDLs can be used to specify the function of semiconductor circuitry at register transfer level (RTL). An RTL model defines the behaviour of the semiconductor circuitry at the level of individual registers, including their interconnection and the logic which determines how the values of the registers change during operation of the circuitry. HDLs such as Verilog can include code of at least two types. Firstly, the synthesisable subject of the language which specifies an RTL model of the semiconductor circuitry being designed. Secondly, HDLs can include other language which is executable, along with the synthesisable subset, by a simulation program. For example, it is common practice to use an HDL to define a "test harness" which provides an interface and specifies data to be input to simulated semiconductor circuitry. Test harnesses can also be developed in specialised languages such as Vera and Specman E (Vera and Specman E are Trade Marks).

The next stage in semiconductor circuitry design is to use the RTL model to specify the structure of the semiconductor circuitry at gate level, i.e. in the form of logic gates and their interconnections, a so-called netlist. This process is semi-automated by synthesis software applications. Gate level logic is then used to specify the precise layout of the logic gates on a semiconductor wafer, and to then prepare masks for use in the fabrication of one or more microchips. Again, this process is semi-automated using software applications.

It is both costly and time-consuming to prepare masks and manufacture semiconductor circuitry. It is therefore economically vital to test semiconductor circuitry, and verify its design, prior to specifying masks and fabricating the microchips.

Furthermore, there are many circumstances in which it is desirable to simulate the function of semiconductor circuitry on a computer. For example, microchips including both one or more microprocessors and embedded software, a configuration referred to as system on a chip (SOC), require simulation during and after their design process. Simulations of SOCs and other semiconductor circuitry are of benefit both to the programmers whose role it is to develop the embedded software, and both software and hardware designers wishing to develop systems including the SOCs.

It has been known for some time how to simulate the function of semiconductor circuitry by simulating the RTL model. Although such simulations are generally accurate, as RTL models fully define the function of semiconductor circuitry, this process is slow.

VTOC (VTOC is a Trade Mark), available from Tenison Technology EDA Limited (Cambridge, England), is a software application which compiles a register transfer level description of a semiconductor into a software emulator of semiconductor circuitry, in a computing language, such as C, C++ or SystemC. The resulting emulator of a semiconductor can be linked to other computer programs, compiled, and used by systems developers, and developers of embedded code, to accurately simulate the function of the emulated semiconductor circuitry during the design process.

However, the validity of a software emulator of semiconductor circuitry is critically dependent on it being verifiable that the software emulator provides the same output in all relevant circumstances as an RTL model derived from the same HDL code.

It is therefore an object of the present invention to provide a method of verifying that two simulations of semiconductor circuitry are equivalent. Specific embodiments of the present invention aim to verify that a software emulation of semiconductor circuitry is equivalent to an RTL model of the same circuitry.

When an HDL model of a microchip is simulated, it is normal practice to generate a trace file. A common standardised trace file format at the present time is VCD (value change dump), specified in IEEE standard 1364, as amended from time to time. HDLs typically include specifications of trace files. Verilog VCD details in time order, the values of inputs, outputs, registers and some wires in the simulated semiconductor circuitry. By analysis of a trace file, a designer can check the function of a model. Wave trace viewer programs are used by engineers to view the changes in input, output, register and wire values with time.

A separate trace file can be output by a software emulator of semiconductor circuitry, but only if a suitable test harness is prepared for use with the software emulator. However, it can be very difficult to prepare a suitable test harness to drive a software emulator using data which can be shown to be equivalent to that generated by the HDL test harness used to drive the HDL definition of semiconductor circuitry during RTL simulation and produce the trace file. One approach that is known is to interface the test harness specified in the HDL language from which the RTL trace file was prepared with the software emulator. Such a test harness can be interfaced with a software emulator of semiconductor circuitry written in for example, C, using an interface such as PLI. This is very difficult to do in practice. Furthermore, if an error is generated during such a simulation, there is no easy way to know where or when within the simulation the error took place.

Accordingly, it is an object of some embodiments of the present invention to simplify the process of running a software emulator of semiconductor circuitry within a test harness, particularly one which is specified in a hardware definition language. Such embodiments aim in particular to allow a software emulator of semiconductor circuitry produced from an RTL description of semiconductor circuitry to be executed within the same test harness as has been prepared for testing the RTL description.

It is a further object of some embodiments of the present invention to enable a comparison as to whether two simulations of semiconductor circuitry are equivalent to be carried out, which allows the location and simulator time at which an error indicating non-equivalence takes place to be determined.

There are various other reasons why a trace file output by a software emulation of semiconductor circuitry, such as VTOC, cannot readily be compared with a VCD trace file of an RTL model.

For example, one problem faced in comparison of a trace file in VCD format (or similar format) from simulation of an RTL model, and a software emulator of semiconductor circuitry such as VTOC is that registers and wires may be defined a plurality of times in the same VCD file. For example, a 32 bit register may be defined using the $var declaration and one or more individual bits of this vector may be declared again, with different identifiers. Thus, the same register or part thereof may be output several times in a trace file, with different identifiers whenever it is updated. It is difficult to deal automatically with these aliases.

Furthermore, the VCD format allows value changes which take place at the same time to be output in any order. Therefore, strict comparison of the output of two trace files could identify errors which are simply due to the ordering in which simultaneous value changes are presented.

Software emulators of semiconductor circuitry, such as VTOC models, achieve an improvement in execution speed over RTL models in several ways. One particular way in which this is achieved in some implementations (for example, VTOC) is by use of a cycle-accurate model. Unlike an RTL model which specifies changes in the values of registers which take place during clock cycles, a cycle-accurate software emulator of semiconductor circuitry outputs the values of registers only at the beginning/end of successive clock cycles. A second method by which such models may achieve an improvement in execution speed over RTL model simulators is by providing a two-state output, i.e. an output consisting only of logical 0's and 1's. This is in contrast to RTL models which typically also include metalogical values, x (undefined) and z (undriven). In addition, software emulators may not model the values of any wires which may be contained in an RTL model (or may create new variables with no corresponding signal in the RTL model).

Thus, the VCD produced by a simulation of an RTL model and the trace file of a software emulator such as VTOC cannot be readily compared.

Accordingly, it is difficult to verify that an RTL model and a software emulator of semiconductor circuitry are equivalent.

It is therefore an object of the present invention to provide a method of verifying an RTL model and a software emulator of semiconductor circuitry, applicable where the software emulator includes one or more of the features of being cycle-accurate, having a two-state output, excluding wires from its model, or including variables which are not equivalent to signals in an RTL model.

BRIEF DESCRIPTION OF THE INVENTION

According to a first aspect of the present invention there is provided a method of simulating semiconductor circuitry comprising the steps of receiving trace data from a first simulation of the semiconductor circuitry, the trace data comprising information about the simulated times at which inputs to the semiconductor circuitry in the first simulation made transitions, and the values to which those inputs transition; and outputting the values of inputs to the semiconductor circuitry to a second simulation of semiconductor circuitry.

This has allowed the second simulation of the semiconductor circuitry to be driven using the same inputs to the semiconductor circuitry as were used to drive the first simulation. This has avoided the need for complex interfacing, For example, avoiding the need to provide an interface between a hardware definition language test harness as first simulation, and a program produced automatically in a language such as C, C++, or SystemC.

The received values of the inputs may be reformatted for outputting to the second simulation. The data from the first simulation may be comprised within a trace file, such as a value change dump file.

The first simulation is preferably a register transfer level simulation of semiconductor circuitry driven by a test harness. The register transfer level simulation preferably comprises program code in a hardware definition language, and executed by a hardware definition language simulator program. The test harness is typically written in the same hardware definition language as the RTL simulation, e.g. Verilog or VHDL, or a specialised test harness language such as VERA or SPECMAN E.

The second simulation preferably comprises a computer program derived from a register transfer level simulation of the same semiconductor circuitry.

The second simulation may be a cycle-accurate software emulator derived from the register transfer level simulation of the same semiconductor circuitry. The second simulation may comprise a computer program derived from a register level simulation of the same semiconductor circuitry. The computer program may be interpreted or may be an executable program, or library routine. The method may comprise the step of setting variables of the computer program of the second simulation to values equivalent to values output by the first simulation.

The information about the simulated times at which inputs to the semiconductor circuitry in the first simulation changed may be output to the second simulation of semiconductor circuitry sequentially in simulated time order.

The second simulation may be stepped responsive to a specific stimulus. For example, the second simulation may be stepped responsive to determination of a rising or falling clock edge, as appropriate.

Further preferred features correspond to features of the second aspect, below.

According to a second aspect of the present invention, there is provided a method of determining whether first and second simulations of semiconductor circuitry are equivalent, where the first and second simulations provide data indicative of the simulated time when one or more registers of the simulated semiconductor circuitry make transitions, the method comprising the steps of:—
in respect of at least one of the said registers, in respect of a plurality of transitions, responsive to determination that the value of the register simulated by the first simulation makes a transition to a value which is not equivalent to the value of the said register simulated by the second simulation, determining that the first and second simulations are not equivalent, unless the value of the said register simulated by the second simulation subsequently make a corresponding transition to a value equivalent to the value of the said register simulated by the first simulation at a simulated time fulfilling at least one test other than that the corresponding transition takes place at the same simulated time in each simulation.

The method thereby allows the first and second semiconductor simulations to be compared, to determine whether their outputs are equivalent, without requiring that their outputs are identical.

Preferably, it is determined that the first and second simulations are not equivalent, if the value of the said register simulated by the second simulation makes a further transition to a non-equivalent value before the value of the said register simulated by the second simulation has made a corresponding transition to a value equivalent to the value of the said register simulated by the first simulation.

The test may alternatively or as well comprise determining that the first and second simulations are not equivalent, unless the value of the register simulated by the first simulation make a corresponding transition to an equivalent value within a simulated time fulfilling at least one test other than that the corresponding transition takes place at the same simulated time.

Preferably, the method includes the step of analysing data concerning successive transitions in the value of at least one of the said registers simulated by the first and second simulations, in simulated time order.

Thus, the method may further comprise the steps of, in respect of the one or more registers:

(i) initializing a stored state associated with the respective register to a first state indicative that the values of the associated register in the first and second simulations are equivalent at a simulated time, (ii) analysing data concerning successive transitions in the value of the register simulated by the first and second simulations, in simulated time order, (iii) responsive to a transition in the value of the register simulated by the first simulation to a value which is not equivalent to the value of the said register simulated by the second simulation whilst the stored state associated with the said register is the first state, changing the said stored state to a second state, (iv) responsive to a transition in the value of the register simulated by the first simulation to a further non-equivalent value, whilst the stored state associated with the said register is the second state, changing the stored state associated with the said register to a third state, responsive to which it is determined that the first and second simulations are not equivalent, (v) responsive to a transition in the value of the said register simulated by the second simulation to a value equivalent to the value of the said register simulated by the first simulation, (optionally after checking that the stored state associated with the said register is in the second state), changing the said stored state to the first state.

Preferably, the method further comprises the step of, responsive to a transition in the value of the said register simulated by either or both simulations so that the simulated values of the registers become equivalent when the stored state associated with a register is the third state, changing the said stored state to the first state. As with point (v) above it is optional whether to check that the state register is in the second or third state when it has been determined that the simulated values of the register have become equivalent.

The method preferably also comprises the step of determining the first and second simulations are not equivalent, if the value of the register simulated by the second simulation makes a further transition to a non-equivalent value before the first simulation has made a corresponding transition to an equivalent value.

The method may comprise the steps of, for the one or more registers:

(i) initializing a stored state associated with the respective register to a first state indicative that the values of the associated register in the first and second simulations are equivalent at a simulated time, (ii) analysing data concerning successive transitions in the value of the register simulated by the first and second simulations, in simulated time order, (iii) responsive to a transition in the value of the register simulated by the first simulation to a value which is not equivalent to the value of the said register simulated by the second simulation whilst the stored state associated with the said register is the first state, changing the said stored state to a second state, (iv) responsive to a transition in the value of the register simulated by the second simulation to a value which is not equivalent to the value of the said register simulated by the first simulation whilst the stored state associated with the said register is the first state, changing the said stored state to a fourth state, (v) responsive to a transition in the value of the register simulated by the first simulation to a further non-equivalent value, whilst the stored state associated with the said register is the second state, changing the stored state associated with the said register to a third state, responsive to which it is determined that the first and second simulations are not equivalent, (vi) responsive to a transition in the value of the register simulated by the second simulation to a further non-equivalent value, whilst the stored state associated with the said register is the fourth state, changing the stored state associated with the said register to a third state, responsive to which it is determined that the first and second simulations are not equivalent, (vii) responsive to a transition in the value of the said register simulated by the second simulation to a value equivalent to the value of the said register in the first simulation, (optionally after checking that the stored state associated with the said register is in the second or fourth state), changing the said stored state to the first state.

The method may further comprise the step of, responsive to a transition in the value of the said register simulated by either or both simulations so that the simulated values of the registers become equivalent, when the stored state associated with a register is the third state, changing the said stored state to the first state.

The value of the stored state may be set to the first state without reference to the current value of the stored state when it is determined that the value of the register simulated by both simulations have equivalent values.

Preferably, the data indicative of the simulated time when one or more registers of the simulated semiconductor circuitry make transitions comprises the times at which transitions occur and the values to which registers make transitions at those times. Such data, concerning either or both simulations of semiconductor circuitry, may be comprised in a trace file, produced by the respective simulation whilst the respective simulation is carried out.

Either or both simulations of semiconductor circuitry may be carried out prior to determination whether first and second simulations of semiconductor circuitry are equivalent. For example, a register transfer level simulation of semiconductor circuitry, written in a hardware definition language and driven by test harness software may be executed prior to the equivalence test.

Either or both simulations of semiconductor circuitry may be carried out at the same time as determination whether the first and second simulations of semiconductor circuitry are equivalent. For example, a software emulator, including a cycle-accurate software emulator, prepared by e.g. VTOC, may be executed stepwise during the determination process.

Preferably, data relating to the first simulation includes data relating to the values of inputs to the simulated semiconductor circuitry. Typically, trace files, in the form of value change dump files, include data concerning transitions made to the values of input wires of the simulated semiconductor circuitry.

Data relating to the values of inputs to the simulated semiconductor circuitry from the first simulation may used sequentially, in simulated time order, to provide the values of inputs to the second simulation. Data relating to inputs may be read in from a trace file, in simulated time order, and output in a form suitable for use by the second simulation. Where the second simulation is a software application with an interface which makes available the address of its variables (e.g. handles to variables and objects) the variables can be set automatically.

Preferably, the data relating to the first simulation includes data relating to clock inputs to the simulated semiconductor circuitry. Data relating to the first simulation may be analysed in simulated time order, and inputs to the second simulation may be set responsive to determination of either or both of a rising or falling edge of a clock input in the data relating to the first simulation, whereupon the second simulation is then stepped. Thus, the execution of the second simulation can be carried out stepwise, with appropriate input values derived from, e.g. a trace file output during the execution of the first simulation.

As well as, or instead of, the above criteria, it may be determined that the first and second simulations are not equivalent, if the simulated time between corresponding transitions in the value of a register to equivalent values, as simulated by the first and second simulations, exceeds a predetermined non-zero threshold.

The method may include the step of, responsive to determination that the first and second simulations are not equivalent, outputting data concerning the simulated time to which the said determination refers. Output data may include, for example, information about the values of some or all registers in either or both the first and second simulations, at the said simulated time. Thus detailed information about non-equivalences can be output, which is not readily possible if a software emulator, such as a C or C++ computer program is interfaced with a hardware definition language test harness, for example using PLI.

Preferably, the second simulation implements a cycle accurate model of semiconductor circuitry.

Preferably, the first simulation is execution of a register transfer level description of semiconductor circuitry, and the second simulation comprises a computer program derived from the same register transfer level description. For example, the first simulation may be an HDL program executed by a simulator program. The second simulation may comprise the execution of a computer program interpreted prepared by a computerised process from the same HDL program. The computerised process may have prepared an executable or interpretable program which is the basis of the second simulation, or program code in a programming language (such as C, C++ or System C) which is compiled to form a program that is the basis of the second simulation.

The data provided by either or both of the first and second simulations may include metalogic values. For example, bits of signal simulated by the first simulation may be one or more of x (undefined) and z (undriven) as well as logical 0 or 1.

Preferably, where either or both of the first and second simulations may include metalogical values, a register simulated by the first semiconductor simulation is determined to be equivalent to the register simulated by the second semiconductor simulation if the said registers correspond in every bit which is not in a metalogic state in either or both simulated registers.

Thus it is possible to determine whether a simulation including metalogical values is equivalent to a simulation that does not include metalogical values.

As the method is responsive to determination that registers simulated by the first and second simulations are not equivalent, changes in simulated bits which are in a metalogic state in either or both simulations need not be taken into account. This avoids declaring unnecessary errors due to glitches etc., or changes in undriven or undefined values which are not important.

According to a third aspect of the present invention there is provided a computer program product comprising a computer readable carrier encoding a computer program comprising program code devices configured to receive trace data from a first simulation of semiconductor circuitry, the trace data comprising information about the simulated times at which inputs to the semiconductor circuitry in the first simulation make transitions, and the values to which those inputs transition; and program code devices configured to output the values of inputs to the semiconductor circuitry According to a fourth aspect of the present invention there is provided a computer program product for determining whether first and second simulations of semiconductor circuitry are equivalent, where the first and second simulations provide data indicative of the simulated time when one or more registers of the simulated semiconductor make transitions, the computer program product comprising a computer readable carrier encoding a computer program comprising program code devices configured to, in respect of at least one of the said registers, in respect of a plurality of transitions, responsive to determination that the value of the register simulated by the first simulation makes a transition to a value which is not equivalent to the value of the said register simulated by the second simulation, determine that the first and second simulations are not equivalent, unless the value of the said register simulated by the second simulation subsequently makes a corresponding transition to a value equivalent to the value of the register simulated by the first simulation at a simulated time fulfilling at least one test other than that the corresponding transition takes place at the same simulated time in each simulation.

Although the embodiments of the invention described with reference to the drawings comprise a method for execution by computer software on computer apparatus, the invention also extends to computer programs, particularly computer programs on a carrier, and electronic circuitry (such as an integrated circuit), adapted for putting the invention into practice. The program may be in the form of source code, object code, a code intermediate source such as in a partially compiled form, an executable file for download from the internet, whether in a compress or uncompressed form, or in any other form suitable for the implementation of the processes according to the invention. The carrier can be any entity or device capable of carrying the program.

For example, the carrier may comprise a storage medium, such as a ROM, for example a CD ROM, a DVD ROM or a semiconductor ROM, or a magnetic recording medium, for example a floppy disk or hard disk. Furthermore, the carrier may be a transmissible carrier such as an electrical or optical signal which may be conveyed via electrical or optical cable or by radio or by other means. Where the program is embodied in a signal which may be conveyed directly by a cable or other device or means, the carrier may be constituted by such cable or other device or means.

DESCRIPTION OF THE DRAWINGS

FIG. 8 is Program Listing 1 being Verilog code specifying an example device under test, which implements a counter;

FIG. 9 is Program Listing 2 being a test harness, also written in Verilog, for specifying stimuli to the device under test of Program Listing 1 when the device under test is simulated;

FIGS. 10A, 10B and 10C are Program Listing 3 being a trace file, referred to as a value change dump, output by Verilog-XL (Verilog-XL is a Trade Mark) when the device under and test harness of Program Listings 1 and 2 is executed;

FIGS. 11A, 11B and 11C are Program Listing 4 being a C++ program derived from Program Listing 1 by VTOC 1.3.1; and FIGS. 12A through to 12I are Program Listing 5 being the output of a program according to the present invention, executed with the trace file of Program Listing 3 as an input, driving an application compiled from the C++ program of Program Listing 4.

DETAILED DESCRIPTION OF THE INVENTION

Figure 1:
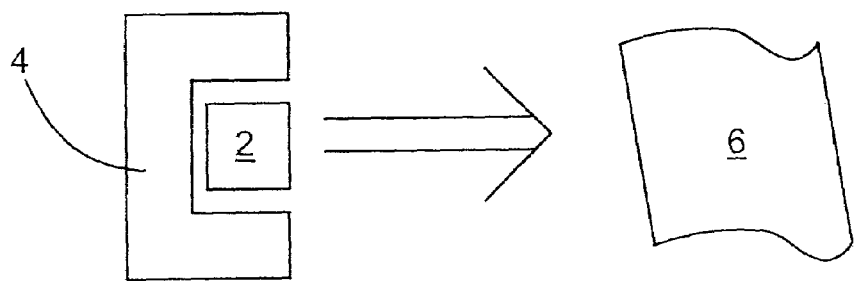
FIG. 1 illustrates a prior art procedure for testing an RTL model of one or more semiconductor devices under test.

FIG. 1 illustrates a procedure which is standard in the art for testing an RTL model of one or more semiconductor devices under test (shown as 2). The RTL model of a semiconductor device under test 2 is prepared in a hardware definition language such as Verilog or VHDL. The RTL model specifies the inputs, outputs and registers which form a simulated device under test and specify the logic indicating how the outputs and registers change in response to stimuli and the states of the simulated device(s).

For test purposes, a further software routine, referred to as a test harness 4, is prepared, typically in the same hardware definition language. The test harness 4 specifies the values with time of simulated inputs to the semiconductor device, for example, input wires, buses and clocks. The test harness may emulate complex hardware such as other computing devices, networks etc. and so inputs to the simulated device maybe dependant on previous outputs from the device.

The test harness 4 and RTL model of the semiconductor device under test 2 are then compiled and executed. Execution of the resulting code constitutes simulating the response of the semiconductor device under test to the stimuli defined by the test harness. Suitable simulators include Verilog XL or Verilog NC (from Cadence, San Jose, Calif.), VCS (from Synopsys, Mountain View, Calif.) or Modelsim (from Mentor Graphics, Wilsonville, Oreg.). (Verilog XL, Verilog NC, VCS and Modelsim are Trade Marks).

During the simulation, a trace file 6 is created. Hardware definition languages specify the format for their trace files 6, known in the art as value change dump (VCD) files. An example VCD file is the Verilog trace file which specifies, in time order, the times at which the values of registers, wires, inputs and outputs make transitions, and the values to which they change. Individual bits of registers can take on binary logical states 0 and 1, and also metalogical values, x (undefined) and z (undriven). The trace file 6 also defines the various signals modelled, including inputs, outputs, wires and registers, and lists the initial value of each signal. The terms 'metalogic' and 'metalogical' refer to any values of a bit other than logic 0 and logic 1.

Figure 2:
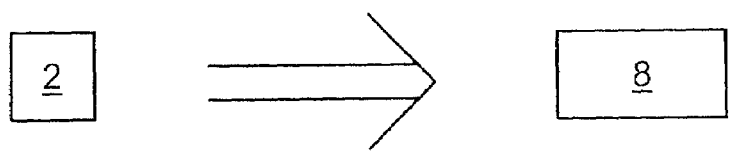
FIG. 2 illustrates a prior art procedure for compiling the RTL model of the device under test of FIG. 1 into a software emulator of one or more devices under test.

FIG. 2 illustrates a second prior art procedure. The same RTL model of the device under test 2 is compiled into a software emulator 8 of the device under test. The software emulator comprises computer code which can be linked to and executed with other programs for the purposes of simulating or testing the proposed device under test. A software emulator is typically prepared in a computing language such as C, C++ or System C. Typically, a software emulator defines variables corresponding to input, outputs, and internal wire and register values, as well as code which when executed (with the input variables set appropriately) causes these output, wire and register variables to take on successive values simulating execution of the device under test. A suitable application for preparing a software emulator of semiconductor circuitry, from an RTL model, is VTOC (VTOC is a Trade Mark), available from Tenison Technology EDA Ltd, Cambridge, England.

Software emulator 8 is typically cycle accurate. That is to say, it provides output which gives the correct simulated values of registers and output wires at the end of clock cycles, but does not necessarily calculate intervening values during clock cycles. Typically, software emulator 8 outputs only bit values logical 0 or 1, and not metalogical values.

To execute software emulator 8, input variables are set, and the emulator is stepped, i.e. the variables corresponding to registers, wires and output wires change following the logic specified in response to a transition in a clock pulse (usually rising and/or falling edge) which leads to a response in the simulated semiconductor (provided that a clock input has changed so as to trigger changes in variables, outputs etc.). VTOC implements this interface by making available, as parameters, the address of its variables corresponding to inputs, outputs, wires and registers.

Figure 3:
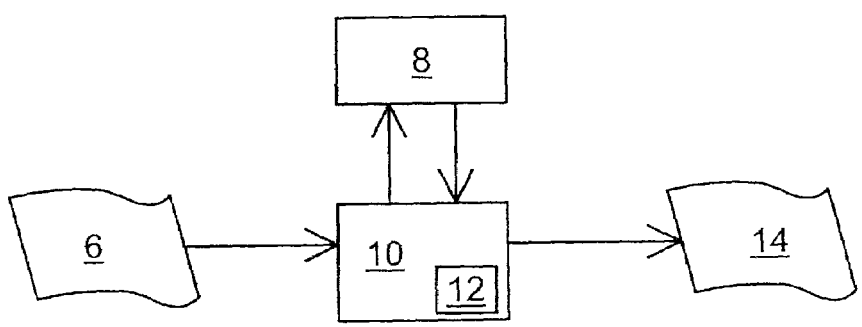
FIG. 3 illustrates components of a data processing device carrying out a method according to the present invention for determining whether first and second simulations of one or more devices under test are equivalent.

FIG. 3 is a schematic illustration of the components of computer software for carrying out the method of the present invention on a data processing device. A software application 10 has an interface to receive data from trace file 6. The software application 10 also has an interface enabling the software application 10 to 1) specify at least the values of inputs to a software emulator of semiconductor circuitry 8, 2) step the software emulator 8 so that it outputs or otherwise makes available or deducible a list of registers that have changed as a result, and 3) receive the values of registers which have changed.

Software application 10 stores values 12 associated with the state of registers of the simulated device under test in memory during execution of the software application 10. The software application 10 provides output indicative of the results of the comparison in the form of a trace file 14.

Figure 4:
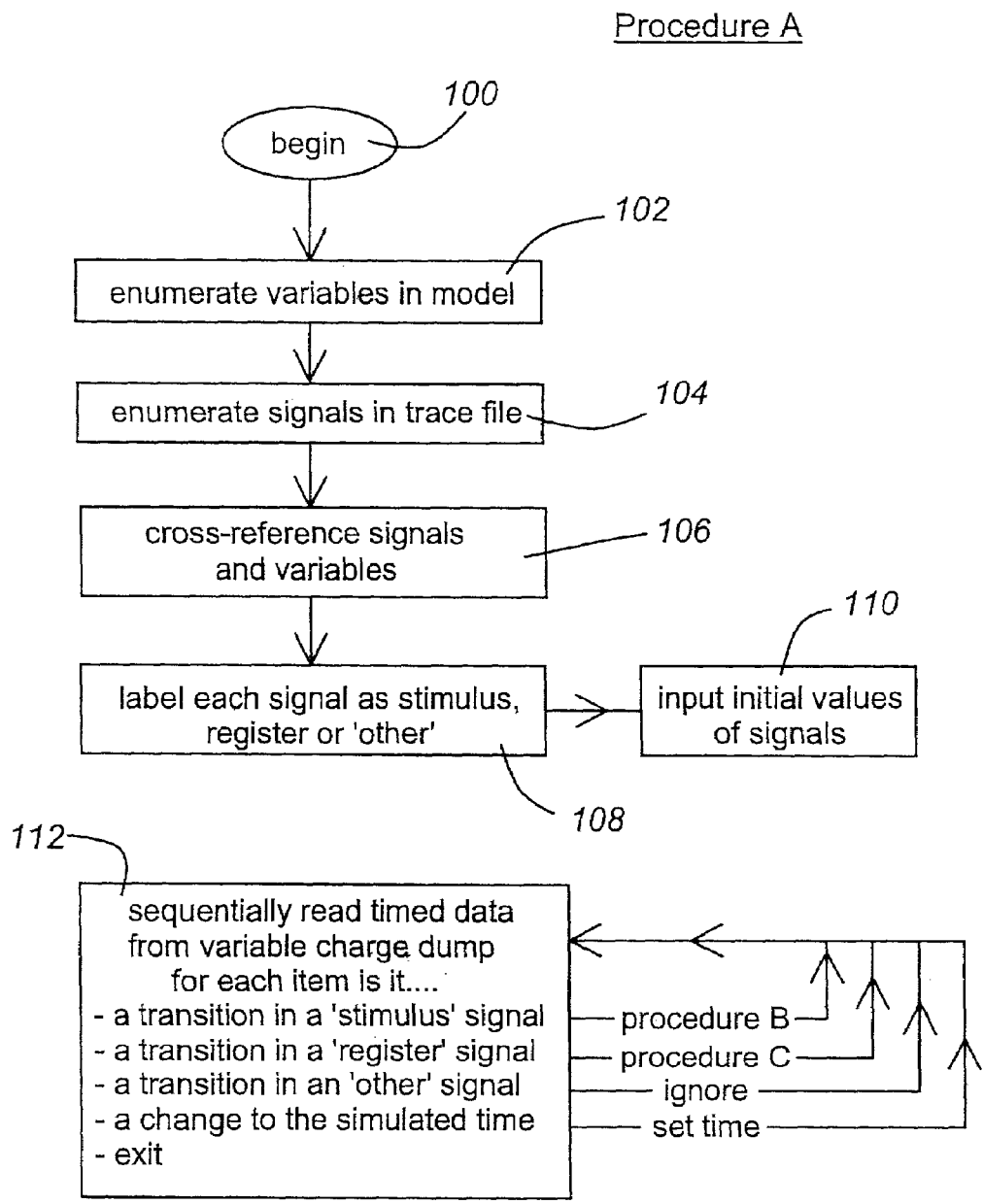
FIG. 4 is a flow diagram of a procedure for determining whether first and second simulations of one or more devices under test are equivalent.

FIG. 4 illustrates a method according to the present invention, in the form of a flow chart. The method aims to determine whether the RTL model which was simulated to prepare the trace file 6 is equivalent to the software emulator of semiconductor circuitry. The process begins 100 when software application 10 is executed.

Software application then proceeds to enumerate 102 the variables in the software emulator 8. The way in which this is done will depend on the format of the software emulator 8. Generally, a software emulator compiler will include within the software emulator 8, information concerning the variables associated with inputs, outputs, and internal wires or registers within the simulated device under test. VTOC prepares the software emulator in the form of code in a programming language which defines a table listing, inter alia, for each external variable used by the software emulator: the type of variable, e.g. input, output, wire, internal wire, register; the size of vectors, arrays etc.; the address in memory where the variable is stored; and ASCII text corresponding to the label ascribed to the signal in the HDL from which the variable was described.

For example, a Verilog module defining a device under test is included in Program Listing 1. (FIG. 1). This begins:
1
2 module simple (clk, reset, count, stop, pass);
3 input clk, reset;
4 input [31:0] count;
5 output stop, pass;
6
7 reg [31:0] r1;
8 reg [31:0] r2;
9 reg stop;
10 reg pass;

Line 2 declares that clk, reset, count, stop and pass are external signals. Line 3 declares that clk and reset are input wires. Line 4 declares that count is a 32-bit vector, with bits labelled from 0 to 31. Line 5 declares that stop and pass are output signals. Lines 7 and 8 declare that r1 and r2 are 32-bit vector registers. As they are not declared to be inputs, VTOC can determine that they are internal registers. Lines 9 and 10 declare that stop and pass are also registers.

From this information a table, as described above, can be prepared by VTOC when producing a software emulator. The definitive of the table in a corresponding C++ software emulator produced by this method is illustrated in lines 64 through 87 of Program Listing 4. (FIGS. 11A, 11B and 11C).

Thereafter, the software application 10 enumerates 104 the signals in the trace file 6. Typically, trace files include definitions of variables corresponding to input and output signals, and the values of wires and registers within the simulated device under test which can be used for enumeration.

Lines 11 to 26 of Program Listing 3 (FIGS. 10A, 10B and 10C) illustrate variable declarations in the VCD trace file output by Verilog-XL, given the Verilog device under test of Program Listing 1, stimulated by the Verilog test harness of Program Listing 2. (FIG. 9). Module main relates to the test harness, and module myTest relates to the device under test. Thus line 19, for example, indicates that ASCII text clk denotes a wire of one bit length which was subsequently represented by the & symbol. By reading in these variable declarations, each signal in the trace file can be enumerated.

Next, the signals from the trace file, and the variables from the software emulator are cross referenced 106. Where there is sufficient information in the software emulator to determine which variables of that emulator correspond with specific signals then the process can be carried out automatically. Otherwise, a greater or lesser amount of manual configuration by a human is required.

In simple circumstances, the signals and variables can be cross referenced simply by use of the same ASCII text as a label. However, there may be signals which do not correspond with variables in the software emulator. Similarly, there may be variables in the software emulator which do not correspond with signals in the trace file. Furthermore, registers, wires and bits thereof, may be defined several times, with different identifiers. Human assistance and checking may be required.

Generally, however, it should be possible to match every signal corresponding to a register in the trace file, with a variable corresponding to the same register in the software emulator.

The cross referencing process may include adapting for a difference in the number of signals and the number of variables corresponding to the same register. For example, a 100 bit register can readily be worked with in Verilog HDL, but two separate variables are required in corresponding C++ code when executed using a C++ implementation for which 64 bits is the largest convenient supported integer type.

Next, each cross referenced pair of signals and variables is labelled 108, either as a stimulus, a register or in the general category of being another type of signal. This may be deduced from the software module, for example the table of variable properties included in a VTOC produced software emulator.

The enumeration and cross referencing described in this example makes use of a table provided in a VTOC produced software emulator. One skilled in the art will recognise that there are numerous different methods by which this cross referencing procedure can be carried out. Information derived from the HDL code will have been required at some stage in the process. In many trace file formats, there will not be enough information in the trace file alone to carry out the cross referencing process or to determine whether signals are inputs, outputs, wires or registers. Equivalent approaches include reading from the HDL source when carrying out the enumeration, cross referencing and labelling process; or, preparing a look up table, separate to the VTOC produced software emulator, using information derived from the HDL source, either at the same time that the software emulator is compiled, or at another time.

Subsequently, the initial values of signals are input 110 from trace file 6. For each initial signal value which is read, the corresponding variable in the software emulator 8 is set, and a copy of the signal value is stored in memory.

In addition, a state register associated with the signal and variable is set to an initial value. In one implementation, the state register associated with a signal will have one of four states illustrated in FIG. 7 during subsequent execution. State 1 (labelled as 201 in FIG. 7) indicates that, at the current simulated time, the values of both the simulated signal in the RTL model and the corresponding variable in the software emulator are equivalent. State 2 (labelled as 202) indicates that a transition has occurred in a signal in the RTL model to a value which is not equivalent to the value of the corresponding variable in the software emulator and that a corresponding transition in the software emulator is awaited. State 3 (labelled as 203) indicates that an error indicative of a non-equivalence of the RTL model and the software emulator has been found. State 4 (labelled as 204) indicates that a transition has occurred in a variable of the software emulator, and that a transition of a corresponding signal in the RTL model to an equivalent value is awaited. A description of the logic associated with the transitions between these states is presented below. (The states are labeled as 1, 2, 3 or 4 in this example, but any values may of course be used, and many ways of implementing the same underlying logic will be apparent to one skilled in the art).

Initially, each state register is set to state 1. Thereafter, timed data is read in sequentially 112 from the variable change dump file 6. In the VCD format associated with Verilog, the bulk of the variable change dump file comprises a series of lines of alphanumeric data, each of which either denotes a time or the value of a signal at the most recently stated time. For example, the following code from program listing 3 indicates that at time 180, the value of the signal indexed as ! made a transition to binary 1, the value of the signal indexed as & made a transition to binary 1, the value of the 32-bit register indexed as ) became binary 100 and the value of the 32-bit register indexed as * became binary 110. Thereafter, at time 190, the value of the signal indexed as ! made a transition to binary 0, and the value of the signal indexed as & made a transition to binary 0.

```
#180
1!
1&
b00000000000000000000000000000100)
b00000000000000000000000000000110*
#190
0!
0&
```

A line of data is read in from the variable change dump file 6 and analysed 100. If the data is a change in the simulated time, a record of the current time is updated. If the data indicates that a signal made a transition, then, if the transition is a 'stimulus' signal, procedure B discussed below is carried out. Otherwise, if the transition is a 'register' signal, procedure C is carried out. If the data relates to any other kind of signal it is generally ignored and the procedure repeats until all the data has been read in and analysed.

Procedure B

Figure 5:
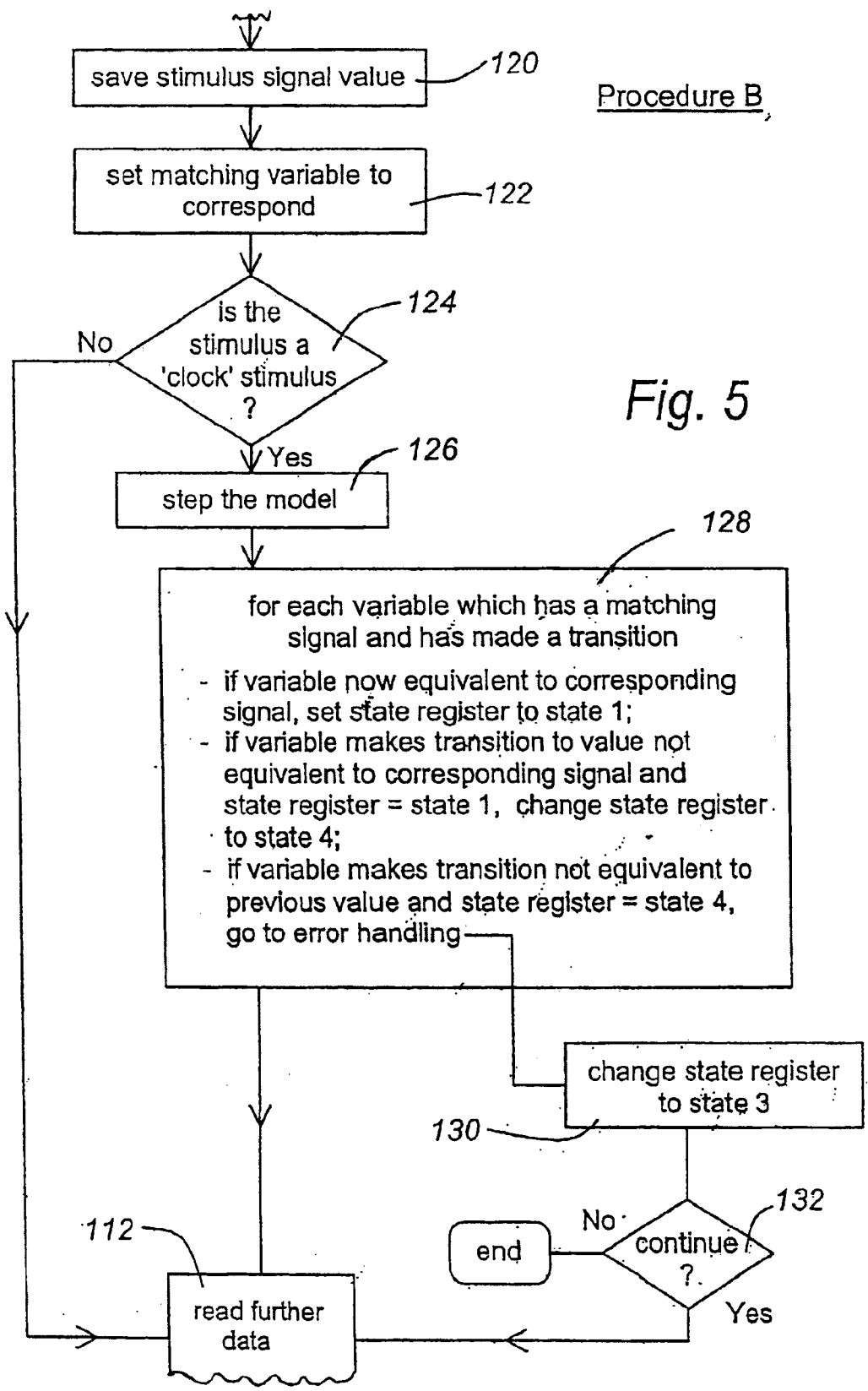
FIG. 5 is a flow diagram of part of the procedure of FIG. 4.

FIG. 5 is a flow-chart of the actions carried out following determination that data corresponds to a transition in a 'stimulus' signal. Firstly, the software application's stored value corresponding to the signal is updated 120. The matching variable in the software 8 is also updated 122, so that next time the software emulator is stepped, it simulates the response of the software emulator to the same set of stimuli which were applied to the RTL simulation that produced the trace file 14.

It is then determined whether the received data corresponds to a clock stimulus 124. If not, no further action is taken in response and the process of reading in data from the trace file 112 continues.

However, if the data corresponds to a clock stimulus, then the software emulator is stepped 126. The emulator responds by updating the values of its variables to indicate the state of the simulated device under test, typically one clock cycle later.

It is then determined 128 which variables (that have matching signals in the RTL model) in the software emulator have made a transition to a value which is not equivalent to the value of the corresponding signal in the RTL model. A variable is considered to be of an equivalent value to the stored signal if it is identical in respect of each bit within the variable for which the stored signal is not in a metalogic value. (This means that there are some changes in the values of variables which will not fulfil this test, for example, where a bit of a variable changes, but the same bit of the corresponding signal is in a metalogic state.)

For each variable which has made a transition to a value not equivalent to the corresponding signal in the RTL model, the corresponding state register is checked. If the corresponding state register is in state 1 (the initial state), it is changed to state 4, indicating that the corresponding variable in the software emulator has changed and that transition in the corresponding signal in the trace file to an equivalent value is awaited.

Figure 7:
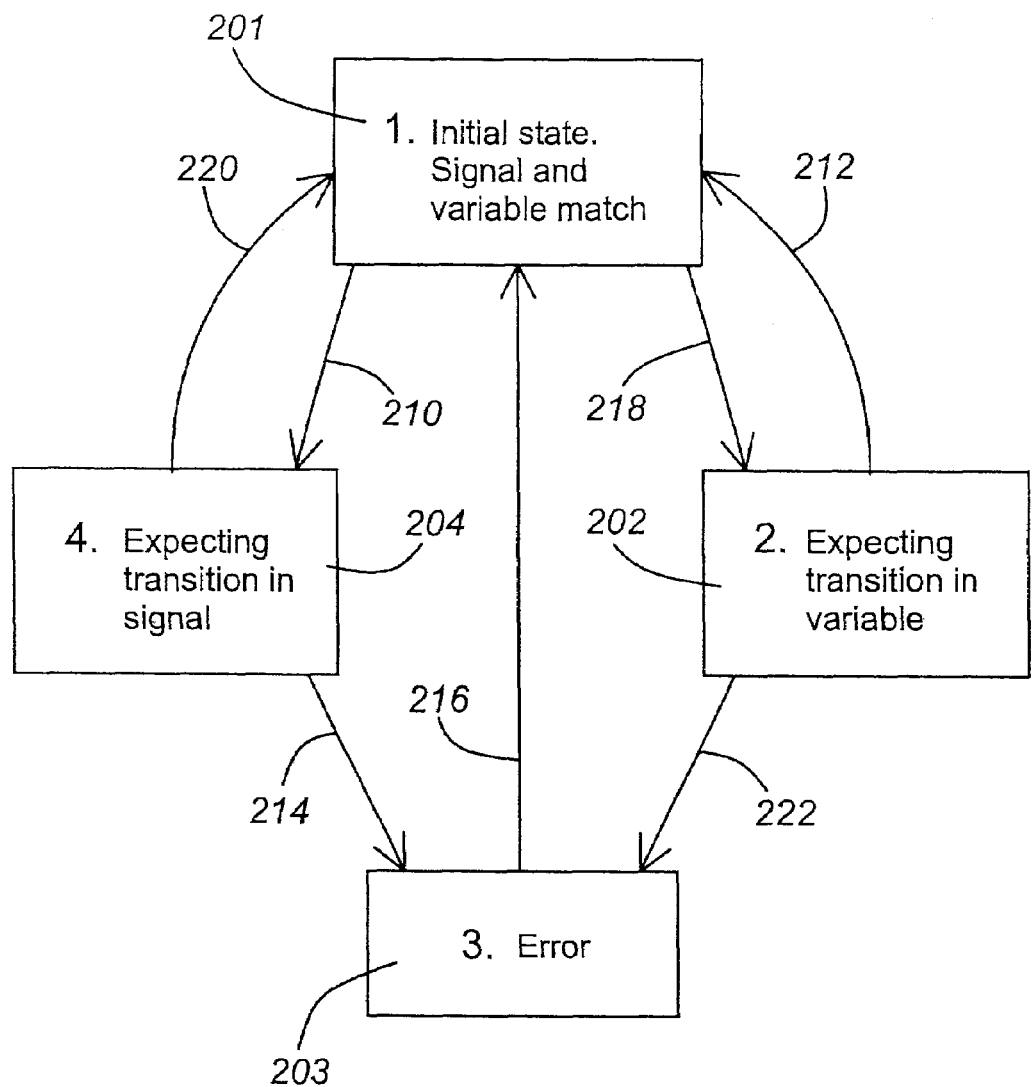
FIG. 7 is a state diagram illustrating the possible states of a state store, and the transitions therebetween.

This is labelled as 210 in FIG. 7. If the corresponding state register is in state 2 (indicating that there has been a transition in the corresponding signal in the trace file to a value non-equivalent to the corresponding variable, and that transition in the corresponding variable in software emulator to an equivalent value is awaited) and the variable has changed to a value equivalent to the stored signal, then the state register is set to state 1, the initial state. This change is labelled as 212 in FIG. 7.

If, however, the corresponding state register is in state 2, and the variable has changed to a further non-equivalent value, then an error is declared and the state register is set 130 to error state 3. This change is labelled as 214 in FIG. 7. It is appropriate to declare an error as this outcome means that the variable in the software emulator has made two transitions to non-equivalent values since it was last equivalent to the corresponding variable in the software emulator. When an error is declared, the procedure decides whether to continue. If, say, 20 errors have been generated it may end 134, otherwise the procedure continues by reading in further data 112 from the trace file, after outputting information concerning the error to a trace file 14.

If the state register is in state 3, indicative that an error has previously been detected, and the variable has made a transition to a value equivalent to the corresponding stored signal, the state register is changed to state 1 (this transition is labelled 216). Thereafter, further data is read from the trace file 110 and the procedure continues.

Procedure C

Figure 6:
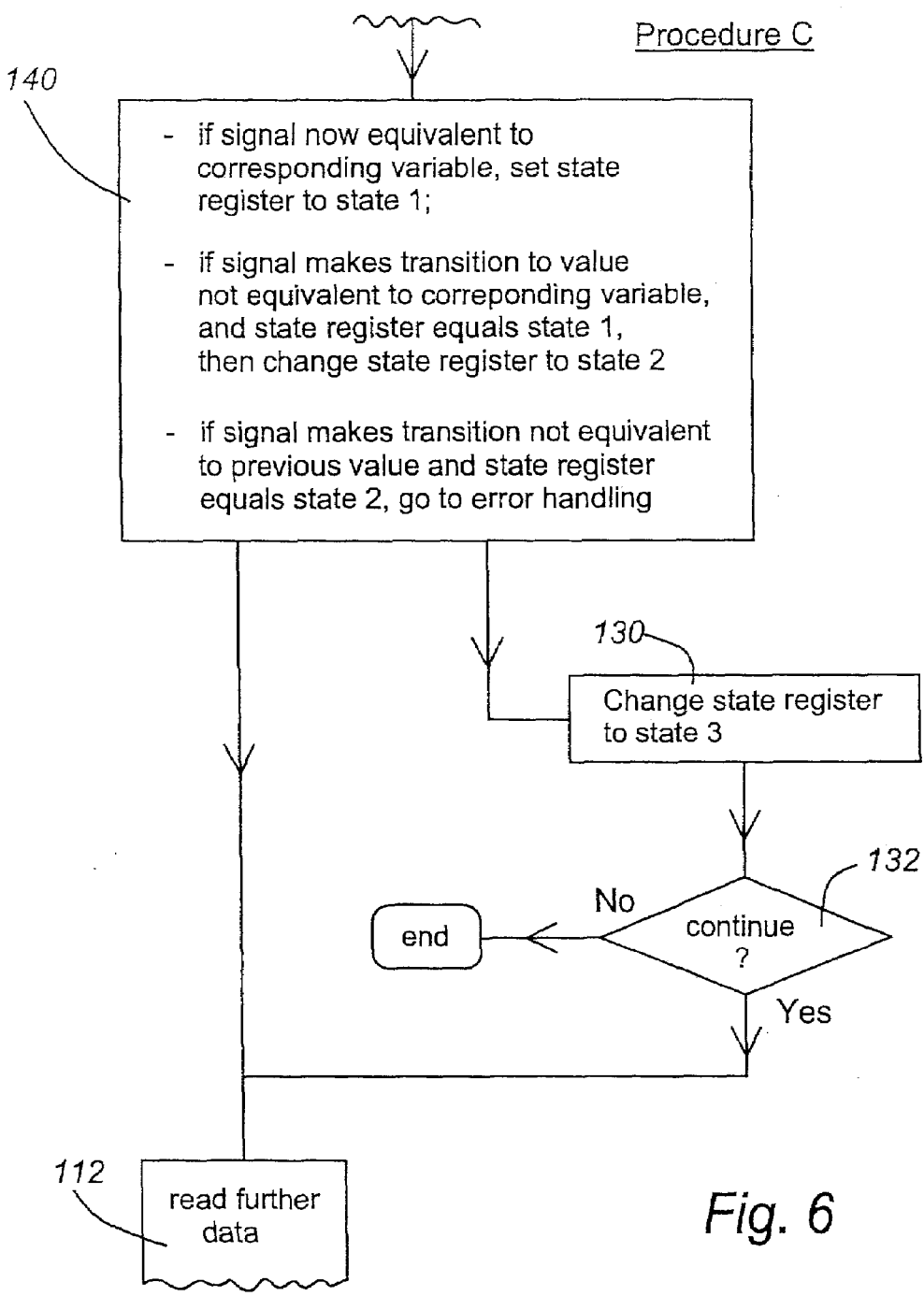
FIG. 6 is a flow diagram of another part of the procedure of FIG. 4.

FIG. 6 is a flow-chart illustrating the events carried out in response to determination that a transition is a transition in a signal corresponding to a register.

The value of the corresponding state register is checked 140. If the corresponding state register is in state 1 (the initial state), and if the signal in the trace file has changed to a value which is not equivalent to the corresponding variable, then the state register is changed to state 2. (This is labelled 218 in FIG. 7.) If the corresponding state register is in state 4 and the signal has changed to a value equivalent to the corresponding variable, then the state register is set to state 1, the initial state. (The change is labelled 220.)

However, if the state register is in state 4, and if the signal in the trace file has changed to a further value which is not equivalent to the corresponding variable, then an error is generated and processed as before and the state register is set to state 3. (This change is labelled 222.) In this circumstance, the signal in the trace file has made a further transition to a non-equivalent value before a transition to an equivalent value took place in the software emulator.

If the state register is in state 3 (the error state) and the signal has made a transition to a value equivalent to the corresponding variable, then the state register is changed to state 1. (This change is labelled 216.)

Thereafter, the procedure continues by reading further data 110 from the trace file.

As will be apparent to one skilled in the art, in either or both of procedures B and C, the state register may be set to state 1 whenever it is determined that the value of the corresponding signal and variable are equivalent, without reference to the current state of the state register.

Accordingly, the above method has allowed the determination of whether the RTL model 2, used to prepare trace file 6, is equivalent to the software emulator 8. However, it has managed to make a suitable comparison, despite variations in the timing between transitions in signal and transitions in the corresponding variables in the software emulator. Furthermore, it has managed to take into account the metalogical values which may be present in trace file 6.

The method has also allowed the software emulator 8 to be driven using precisely the same stimuli that were applied to the device under test 2, by test harness 4, when the HDL definition of the test harness and the device under test were stimulated. This was achieved by establishing which signals are input signals in the trace file 6, cross-referencing these with variables in the software emulator 8, and, sequentially in time order, setting the variables in the software emulator to the values of the corresponding input signal from the trace file 6.

This procedure of reading in input signals from a trace file and outputting them to a software emulator constitutes a useful software tool in its own right, and can be implemented with a different comparison algorithm to that described above, or even without any comparison at all, as part of the process of designing or testing software to run with, or be embedded within, one or more semiconductors.

In the present example, the software emulator 8 is called by the software application 10 during the process of reading data in from trace file 6, whenever the data which is input includes a transition in a signal which may cause the software emulator 8 to update its variables, outputs etc. Typically, such transitions will be the rising or falling edges of one or more clocks. A software emulator produced in VTOC 1.3.1 will in general not respond when it is called unless the value of one or more variables relating to clocks has undergone either a rising edge or falling edge (depending on the particular device under test) transition. However, other software emulators could be envisaged which work on different principles, and are executed in different ways.

As part of this procedure, it may be necessary to convert the values of the signals read in from the trace file to a format appropriate for the software emulator. For example, as described above, one register in the trace file may correspond to one or more variables in the software emulator and vice versa.

A number of variations of the above procedure are now discussed.

EXAMPLE 2

In practice, it has been found that with some software emulators 8, state 4 (labelled 204) is never reached. In circumstances where, due to the design of the underlying logic, and a confidence in the software emulator, the transitions in the signal in the trace file are never at a later simulated time than the corresponding transition in the variable in the software emulator, it is possible to omit state 4, and all the logic relating to state changes 210, 214 and 220.

FURTHER EXAMPLES AND VARIANTS

Although the examples given include data read from a trace file prepared by simulating an RTL model of semiconductor circuitry, with a second simulation of semiconductor circuitry (the software emulation 8), the method can in principle be used with any two simulations of the same semiconductor circuitry. In the example given, the HDL definition of the test harness and device under test is executed in advance, and data is read in the course of carrying out the method, from the resulting trace file 6. However, the software emulator 8, is stepped in response to determination that a clock signal has made a transition. Either or both semiconductor simulations may be executed in advance, with data read from a trace file, or executed concurrently with, or responsive to the method of the present invention.

In the example given above, metalogic values were only possible in one of these semiconductor simulations, namely the HDL model of the device under test 2 and test harness 4. The method could equally be applied to two semiconductor simulations, neither of which, or both of which can include metalogic values. Where both include metalogic values, a transition is only considered to occur when there has been a change in either the signal or corresponding variable, in a bit which is not in a metalogic state in either the signal or the variable.

Additional criteria can be used to determine whether or not two simulations of semiconductor circuitry are equivalent. For example, the time when a signal, and a corresponding variable make transitions to equivalent values can be checked, and an error can be generated if the time between the corresponding transitions exceeds a predetermined value.

In the examples given, the data input from the trace file is in the form of a list of simulated times, followed by a list of the values to which registers changed at that time. The data input from the software emulator is the values to which variables (that have changed when the model was stepped) have changed. This could be determined by checking each variable in turn against a stored copy of a previous value of that variable. Other methods of determining which variables have changed (for example the VTOC model setting a flag when a variable is changed) will be apparent to one skilled in the art.

One skilled in the art will appreciate that the necessary data can be input in other formats, sufficient to indicate that values to which registers change and at least the order, but preferably the time, at which the transitions occur. For example, samples of register values at discrete times could be input, and the times at which transitions occur deduced therefrom. The times at which transitions occur could be dispensed with, and only the order of transitions, and the values to which registers make transitions, be input.

Further modifications and alterations may be made by one skilled in the art within the spirit of the invention herein disclosed.

What is claimed is:

1. A method of simulating semiconductor circuitry comprising the steps of:

receiving trace data from a first simulation of the semiconductor circuitry, the trace data comprising information about the simulated times at which inputs to the semiconductor circuitry in the first simulation make transitions, and the values to which those inputs transition; and outputting the values of inputs to the semiconductor circuitry to a second simulation of semiconductor circuitry, the first and second simulations being different from one another.

2. A method according to claim 1, wherein the received values of the inputs are reformatted for outputting to the second simulation.

3. A method according to claim 1, wherein data from the first simulation comprises a value change dump file.

4. A method according to claim 1, wherein the first simulation comprises a register transfer level simulation of semiconductor circuitry driven by a test harness.

5. A method according to claim 1, wherein the second simulation comprises a computer program derived from a register transfer level simulation of the same semiconductor circuitry.

6. A method according to claim 5 wherein the second simulation is a cycle-accurate software emulator derived from the first simulation, or from program code which is executable or interpretable to form the first simulation.

7. A method according to claim 1, wherein the information about the simulated times at which inputs to the semiconductor circuitry in the first simulation transition is output to the second simulation of semiconductor circuitry sequentially in simulated time order.

8. A method according to claim 7, wherein the second simulation is stepped responsive to a specific stimulus.

9. A method according to claim 8, wherein the second simulation is stepped responsive to determination of a rising or falling clock edge, as appropriate.

10. A method according to claim 1 wherein the information about the simulated times at which input changed transitions the order in which those inputs made transitions.

11. A method of determining whether first and second simulations of semiconductor circuitry are equivalent, comprising the steps of:

receiving trace data from a first simulation of the semiconductor circuitry, the trace data comprising information about the simulated times at which signals of the semiconductor circuitry make transitions, and the values to which those signals transition, the signals comprising at least one signal corresponding to an input to the semiconductor circuitry and at least one signal corresponding to a register or wire of the semiconductor circuitry;

outputting the values of at least one of said input signals to the second simulation of semiconductor circuitry, the second simulation simulating the values with simulated time of the said at least one register or wire of the semiconductor circuitry responsive to the said input signals, and the first and second simulations being different from one another;

and comparing the values with simulated time of the least one register or wire of the semiconductor circuitry as received from the first simulation and as determined by the second simulation and thereby determining whether the first and second simulations are equivalent.

12. A method according to claim 11 wherein the comparison determines that the first and second simulations are not equivalent if, once the value of a register or wire according to one of the simulations makes a transition to a value which is not equivalent to the value of the said register simulated by the other simulation, the value of the said register simulated by the said other simulation does not then make a transition to an equivalent value before the said one of the simulations makes a transition to a further non-equivalent value.

13. A method according to claim 11 wherein the first simulation is a register transfer level simulation of semiconductor circuitry.

14. A method according to claim 12 wherein the second simulation is derived from the first simulation.

15. A method according to claim 14 wherein the second simulation is a cycle-accurate model derived from the first simulation.

16. A computer program product comprising a computer readable storage medium encoding a computer program comprising program code devices configured to receive trace data from a first simulation of semiconductor circuitry, the trace data comprising information about the simulated times at which inputs to the semiconductor circuitry in the first simulation make transitions, and the values to which those inputs transition; and program code devices configured to output the values of inputs to the semiconductor circuitry, the first and second simulations being different from one another.

17. A computer program product for determining whether first and second simulations of semiconductor circuitry are equivalent, wherein said first and second simulations are different from one another, comprising a computer readable storage medium encoding a computer program comprising program code devices configured to receive trace data from a first simulation of the semiconductor circuitry, the trace data comprising information about the simulated times at which signals of the semiconductor circuitry make transitions, and the values to which those signals transition, the signals comprising at least one signal corresponding to an input to the semiconductor circuitry and at least one signal corresponding to a register or wire of the semiconductor circuitry; and further comprising program code devices configured to output the values of at least one of said input signals to the second simulation of semiconductor circuitry, the second simulation simulating the values with simulated time of the said at least one register or wire of the semiconductor circuitry responsive to the said input signals; and further comprising program code devices configured to compare the values with simulated time of the least one register or wire of the semiconductor circuitry as received from the first simulation and as determined by the second simulation and thereby determine whether the first and second simulations are equivalent.

* * * * *